United States Patent [19]

Kanda et al.

[11] Patent Number: 5,162,252
[45] Date of Patent: Nov. 10, 1992

[54] METHOD OF FABRICATING IIL AND VERTICAL COMPLEMENTARY BIPOLAR TRANSISTORS

[75] Inventors: Akihiro Kanda; Mitsuo Tanaka; Takehiro Hirai; Masahiro Nakatani, all of Osaka, Japan

[73] Assignee: Matsushita Electric Industrial Co., Ltd., Osaka, Japan

[21] Appl. No.: 808,691

[22] Filed: Dec. 17, 1991

[30] Foreign Application Priority Data

Jul. 1, 1991 [JP] Japan ................. 3-159268

[51] Int. Cl.$^5$ ............. H01L 21/70; H01L 27/00
[52] U.S. Cl. ............. 437/55; 148/DIG. 87; 257/554; 257/556
[58] Field of Search ............. 437/55; 148/DIG. 87; 357/92

[56] References Cited

FOREIGN PATENT DOCUMENTS

| | | | |
|---|---|---|---|
| 0164560 | 10/1982 | Japan | 437/55 |
| 0067255 | 4/1984 | Japan | 437/55 |
| 59-141261 | 8/1984 | Japan | |
| 0052038 | 3/1985 | Japan | 148/DIG. 87 |
| 2-58865 | 2/1990 | Japan | |

Primary Examiner—Olik Chaudhuri
Assistant Examiner—Long Pham
Attorney, Agent, or Firm—Lowe, Price, LeBlanc & Becker

[57] ABSTRACT

The present invention provides a semiconductor device, in particular, a semiconductor device comprising a vertical npn transistor, a vertical pnp transistor and an IIL which are integrated on the same one-conductivity type semiconductor substrate (1). The IIL comprises an emitter, a base and a collector which are respectively comprised of a high-density n$^+$-type first buried layer (5), a p$^+$-type second buried layer (8) having a lower impurity density than the n$^+$-type first buried layer (5), and at least one of n$^+$-type diffused layer (31).

The semiconductor device thus constituted makes it possible to increase the emitter injection efficiency while the base impurity density is kept high, and also to decrease the base width, so that the collector-emitter breakdown voltage and current gain of the IIL can be more improved and also the operation speed of the IIL can be made higher.

6 Claims, 14 Drawing Sheets 5,162,252

METHOD OF FABRICATING IIL AND VERTICAL COMPLEMENTARY BIPOLAR TRANSISTORS

BACKGROUND OF THE INVENTION

1. Field of the Invention

This invention relates to a semiconductor device comprising an IIL (or I²L, intergrated injection logic) integrated with a vertical npn transistor and a vertical pnp transistor, and a method for its fabrication.

2. Description of the Prior Art

Conventional semiconductor devices can be exemplified by what is disclosed in Japanese Laid-open Patent Application No. 59-141261.

FIG. 11 illustrates a cross section of the structure of an IIL of this conventional semiconductor device. In FIG. 11, reference numeral 1 denotes a p-type semiconductor substrate; and 5, part of the emitter region of the IIL, which is an n+-type buried layer formed at the same time as a collector buried layer of a vertical npn transistor. Reference numeral 6 denotes part of a separating region, which is a p+-type buried layer formed at the same time as a collector buried layer of a vertical pnp transistor. Reference numeral 9 denotes an n−-type epitaxial layer, and 10 and 12 denote part of the separating region and part of the base region of the IIL, respectively, which are p−-type diffused layers formed at the same time as the collector region of the vertical pnp transistor. Reference numeral 14 denotes an n+-type diffused layer that constitutes part of the emitter region of the IIL, and 17 and 18 denote an injector and part of the base region, respectively, of the IIL, which are p-type diffused layers formed at the same time as the base region of the vertical npn transistor. Reference numerals 20 and 110 denote a collector and part of the emitter region, respectively, of the IIL, which are n-type diffused layers formed at the same time as the base region of the vertical pnp transistor. Reference numeral 23 denotes a collector contact region of the IIL, which is an n+-type diffused layer formed at the same time as the emitter region of the vertical npn transistor.

In the conventional semiconductor device constituted in this way, the p−-type diffused layer 12 serving as the base of the IIL is a diffused layer with a low impurity density formed at the same time as the collector region of the vertical pnp transistor, and hence an emitter injection efficiency can be made higher and current gain can be made greater.

Conventional semiconductor devices that have made the speed of IIL higher without causing a decrease in emitter-collector breakdown voltage can be exemplified by what is disclosed in Japanese Laid-open Patent Application No. 2-58865.

FIG. 12 illustrates a cross section of the structure of an IIL of this conventional semiconductor device. In FIG. 12, reference numeral 1 denotes a p-type semiconductor substrate; 4, an n+-type buried layer serving as a collector buried layer of a vertical npn transistor; and 5, an n+-type buried layer that constitutes part of the emitter region of the IIL, formed at the same time as the n+-type buried layer 4. Reference numeral 6 denotes part of a separating region, which is a p+-type buried layer; and 8, a p+-type buried layer that constitutes part of the base region of the IIL, formed at the same time as the p+-type buried layer 6. Reference numeral 9 denotes an n−-type epitaxial layer; 10, a p−-type diffused layer that constitutes part of the separating region; and 17 and 18 denote an injector and part of the base region, respectively, of the IIL, which are p-type diffused layers formed at the same time as the base region 16 of the vertical npn transistor. Reference numerals 24 and 111 denote an emitter contact region and a collector region, respectively, of the IIL, which are n+-type diffused layers formed at the same time as the emitter region 21 and collector contact region 22 of the vertical npn transistor. Reference numeral 112 denotes a p-type diffused layer that constitutes part of the base region of the IIL; and 113, an n+-type diffused layer that constitutes part of the emitter region of the IIL.

In the conventional semiconductor device constituted in this way, the base of the IIL is formed by the p+-type buried layer 8 and the p-type diffused layer 112, and hence the speed of IIL can be made higher without causing a decrease in emitter-collector breakdown voltage.

However, in such conventional semiconductor devices, for example, the semiconductor device disclosed in Japanese Laid-open Patent Application No. 59-141261, the emitter of IIL with which the p−-type diffused layer 12 comes into contact is the epitaxial layer having a lower impurity density than the p−-type diffused layer 12, and hence it is impossible to greatly improve the current gain. In addition, when the epitaxial layer 9 is made thin so that the speed and compactness of the device can be made higher, the depth of the p−-type diffused layer 12 must be made smaller as a matter of course, which results in a small width of the base of IIL to bring about a state of punch-through between the collector and emitter at a low voltage, resulting in no normal operation of the IIL. On the other hand, making the p−-type diffused layer 12 have a high impurity density in order to avoid such a difficulty brings about a decrease in the current gain and also an increase in the impurity density at the collector region of the vertical pnp transistor, formed at the same time as the p−-type diffused layer 12, resulting in a lowering of the Early voltage. This semiconductor device has been involved in such problems.

In the semiconductor device disclosed in Japanese Laid-open Patent Application No. 2-58865, the collector region 111 of the IIL is formed at the same time as the emitter region 21 of the vertical npn transistor, and hence, in order to maintain the characteristics of the vertical npn transistor, the depth of junction can not be made so much large, and the width of the base of IIL right beneath the collector region 111 can not be made small. Thus this semiconductor device also has had the problem that there is a limit to the improvement in the current gain or achievement of a higher speed of IIL.

SUMMARY OF THE INVENTION

The present invention solves the above problems. An object thereof is to provide a semiconductor device in which an IIL with a high speed, high compactness and high breakdown voltage can be formed and yet a vertical npn transistor and a vertical pnp transistor are integrated on the same wafer.

To achieve the above object, the present invention is basically characterized by a semiconductor device comprising a vertical npn transistor, a vertical pnp transistor and an IIL; said IIL comprising a one-conductivity type semiconductor substrate (1), a reverse-conductivity type first buried layer (5, emitter) formed in said substrate, a one-conductivity type second buried layer (8, base) formed in said first buried layer, a reverse-conductivity type semiconductor layer (9) formed on said semiconductor substrate embracing said first and second buried layers, a one-conductivity type first diffused layer (12, base) coming into contact with said second buried layer, formed in said semiconductor layer, and a reverse-conductivity type second diffused layer (31, collector) formed in singularity or plurality in said first diffused layer and coming into contact with said second buried layer.

Because of the above constitution of the present invention, the emitter impurity density of IIL can be made higher than the impurity density of the base with which the emitter is in contact, and hence an emitter injection efficiency can be made higher and current gain can be made much greater. The base impurity density of IIL can also be increased without increasing the impurity density of a collector region of the vertical pnp transistor. Hence, even when an epitaxial layer is made thin so that the speed and compactness of the device can be made higher, the collector-emitter breakdown voltage in the IIL can be kept at a high level without causing a lowering of the Early voltage of the vertical pnp transistor. Moreover, the collector of IIL can be deeply formed and therefore the base width of the IIL can be made small, and hence the speed of IIL can be made higher. Thus it is possible to accomplish a semiconductor device in which an IIL with a high speed, high compactness and high breakdown voltage, a vertical pnp transistor and a vertical npn transistor are integrated.

DESCRIPTION OF THE PREFERRED EMBODIMENTS

The present invention will be described below with reference to FIGS. 1 to 10 by giving examples grouped into first to third embodiments.

First embodiment

FIGS. 1 to 3A/3B cross-sectionally illustrate a process of fabricating a semiconductor device according to a first embodiment of the present invention, integrated therein with a vertical npn transistor, a vertical pnp transistor and an IIL having an emitter region, a base region, a collector region and an injector region.

Figure 1:
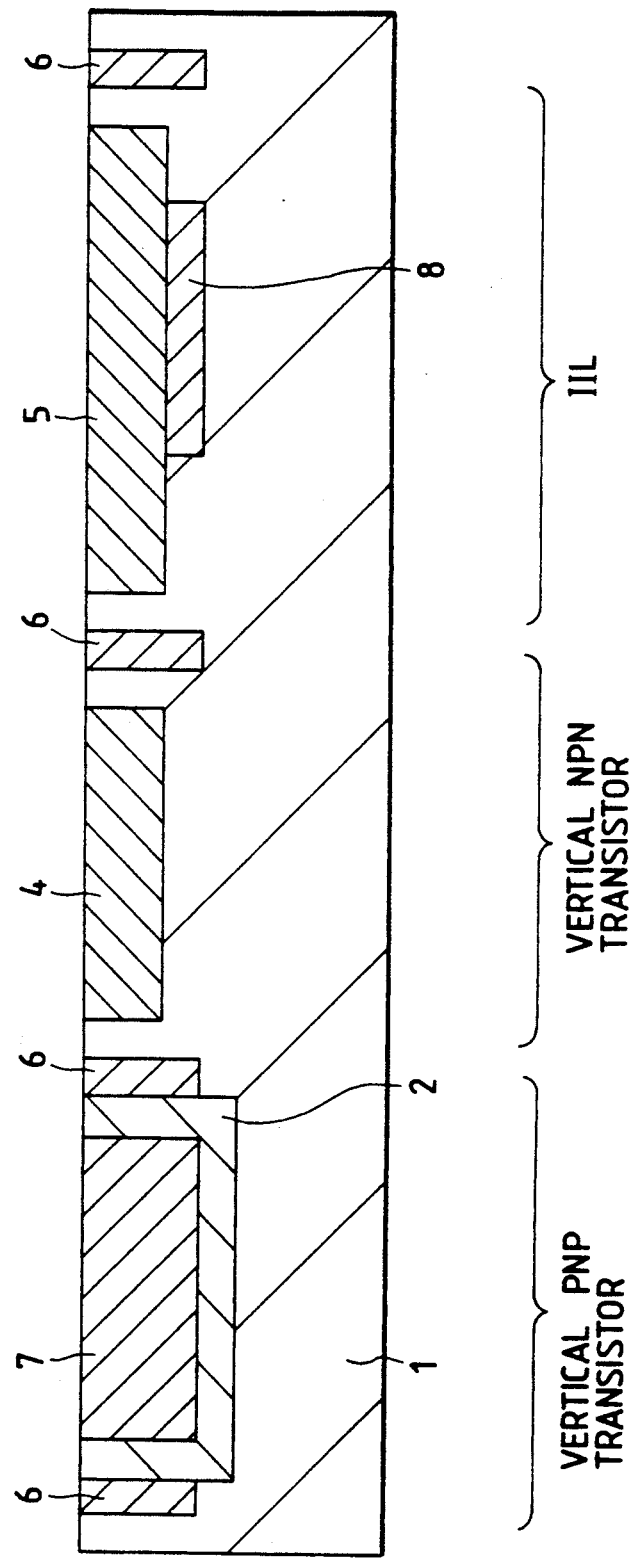
FIG. 1 is a cross-sectional illustration of a first fabrication step in a first embodiment of the present invention.

A p-type (111) semiconductor substrate 1 with an average resistivity of, e.g., from 10 to 20 $\Omega$.cm is ion-implanted with phosphorus under conditions of 40 keV and $1 \times 10^{13}/cm^2$, followed by heating, e.g., at about 1,200° C. for about 120 minutes to form an n-type buried layer 2 which separates the collector region of the vertical pnp transistor from the p-type semiconductor substrate 1. Next, for example, using a resist as a mask, the substrate is ion-implanted with arsenic under conditions of 60 keV and $1 \times 10^{15}/cm^2$, followed by heating at about 900° C. for about 30 minutes to form an n+-type buried layer 4 serving as a collector buried layer of the vertical npn transistor and an n+-type buried layer 5 that constitutes part of the emitter region of the IIL. Next, for example, using a resist as a mask, ion implantation of boron is carried out under conditions of 40 keV and $1 \times 10^{14}/cm^2$, followed by heating at about 1,100° C. for about 180 minutes to form a p+-type buried layer 7 serving as a collector buried layer of the vertical pnp transistor, a p+-type buried layer 8 that constitutes part of the base region of the IIL, and a p+-type buried layer 6 that constitutes part of the device separating region and serves as a lower separating region. In this instance, the coefficients of diffusion of the impurities become larger in order of arsenic, boron and phosphorus, and hence the depths of the buried layers become larger in order of the n+-type buried layers 4 and 5, p+-type buried layers 6, 7 and 8 and the n-type buried layer 2 (FIG. 1).

Figure 2:
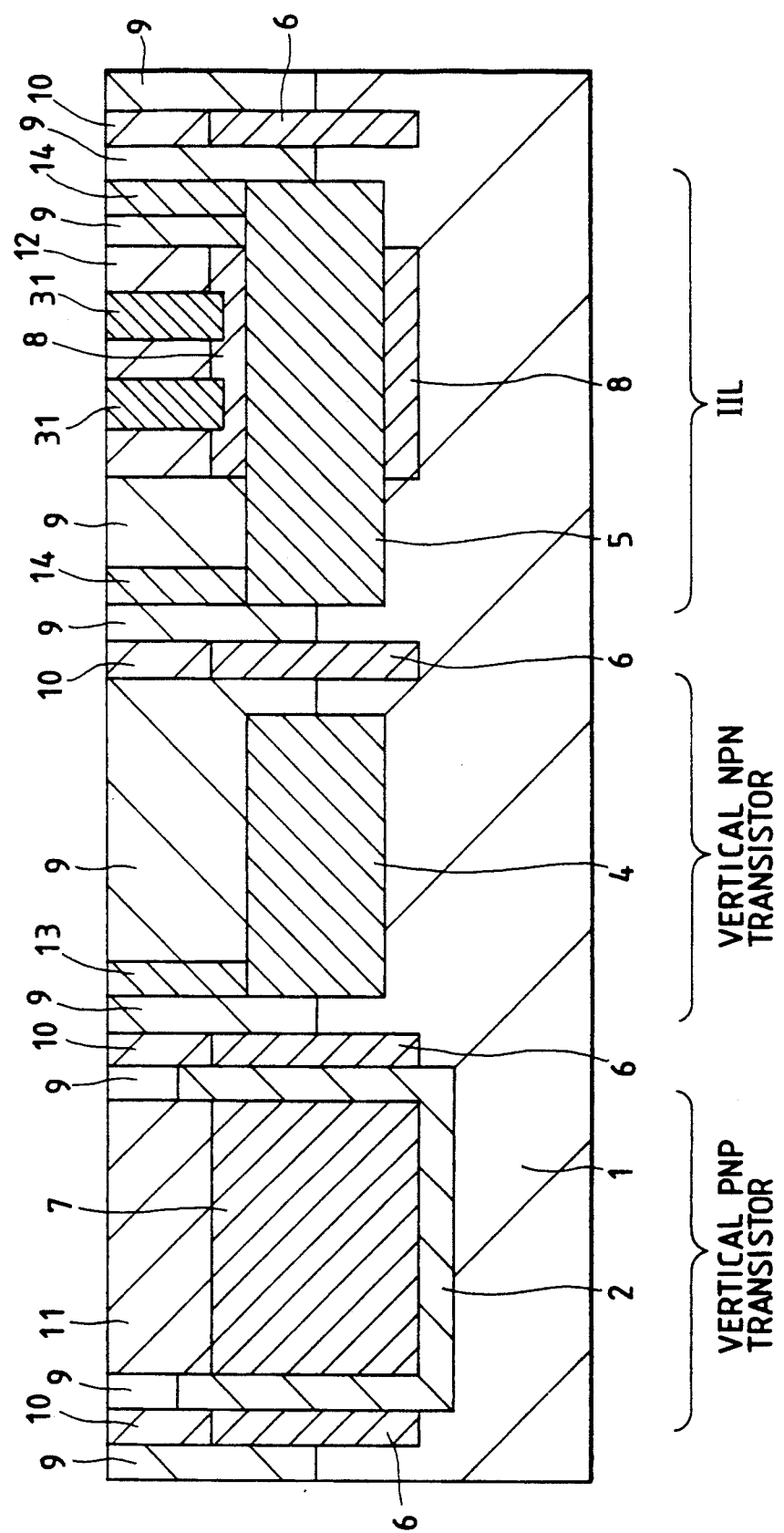
FIG. 2 is a cross-sectional illustration of a second fabrication step in the first embodiment of the present invention.

Next, on the p-type semiconductor substrate 1, an n−-type epitaxial layer 9 with, e.g., an average resistivity of about 1 $\Omega$.cm and a thickness of about 2.5 $\mu$m is formed. Next, for example, using a resist as a mask, ion implantation of boron is carried out under conditions of 80 keV and $2 \times 10^{12}/cm^2$, followed by heating at about 1,100° C. for about 100 minutes to form a p−-type diffused layer 11 that constitutes part of the collector region of the vertical pnp transistor, a p−-type diffused layer 12 that constitutes part of the base region of the IIL, and a p−-type diffused layer 10 that constitutes part of the device separating region and serves as an upper separating region. In this instance, the coefficients of diffusion of the impurities become larger in order of arsenic, boron and phosphorus, and hence the rises of the buried layers become larger in order of the n+-type buried layers 4 and 5, p+-type buried layers 6, 7 and 8 and the n-type buried layer 2. Hence, in the IIL, the p+-type buried layer 8 protrudes from the n+-type buried layer 5 and is connected with the p−-type diffused layer 12, so that the base region of the IIL is formed. Next, for example, using a resist as a mask, ion implantation of phosphorus is carried out under conditions of 80 keV and $3 \times 10^{15}/cm^2$, followed by heating at about 950° C. for about 30 minutes and further by heating at about 1,000° C. for about 145 minutes to form an n+-type diffused layer 13 serving as a collector wall region of the vertical pnp transistor, an n+-type diffused layer 14 that constitutes part of the emitter region of the IIL, and an n+-type diffused layer 31 (which is in plurality in the drawings) serving as the collector region of the IIL (FIG. 2).

Figure 3A:
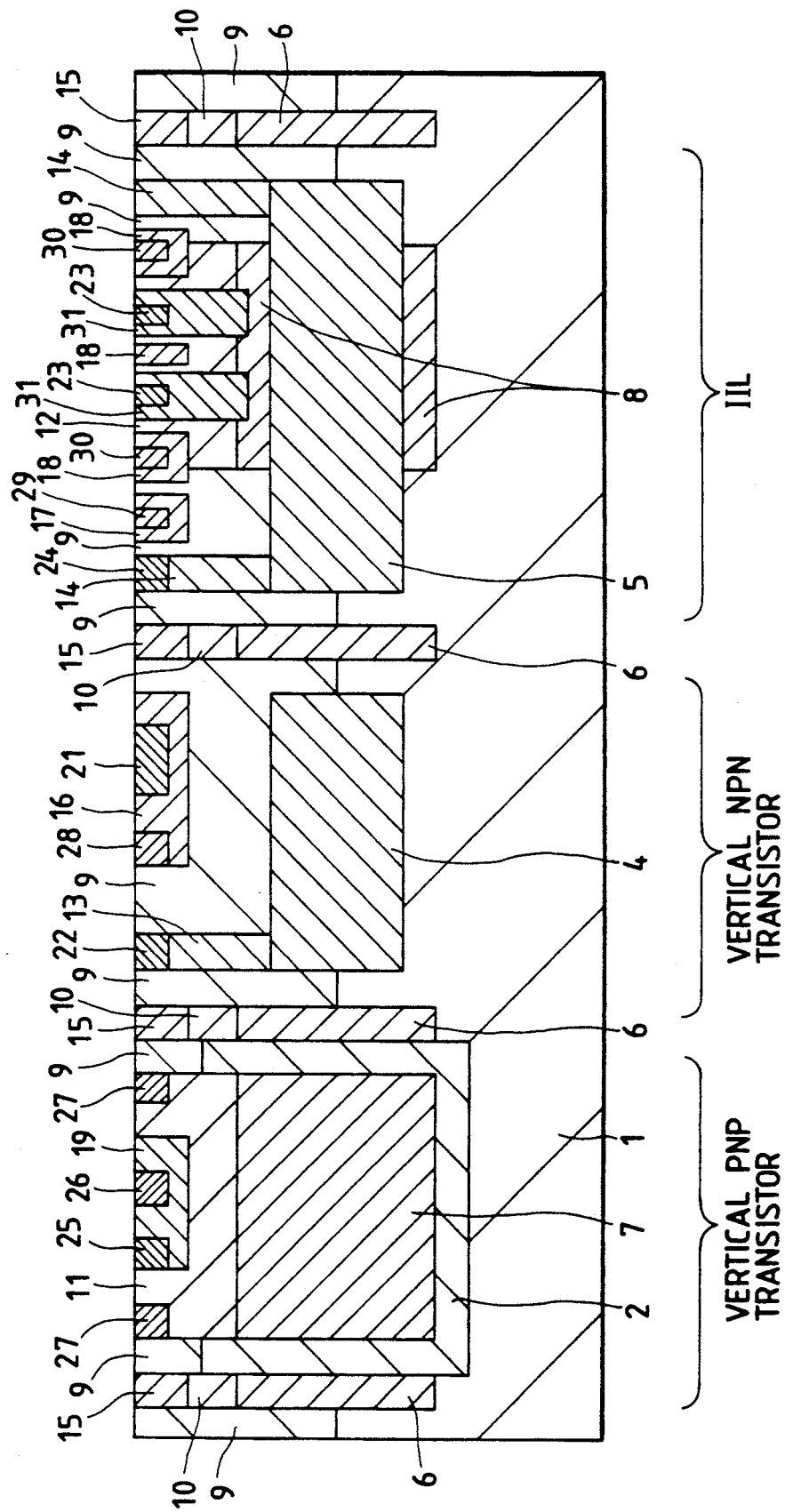
FIG. 3A is a cross-sectional illustration of a third fabrication step in the first embodiment of the present invention.
Figure 3B:
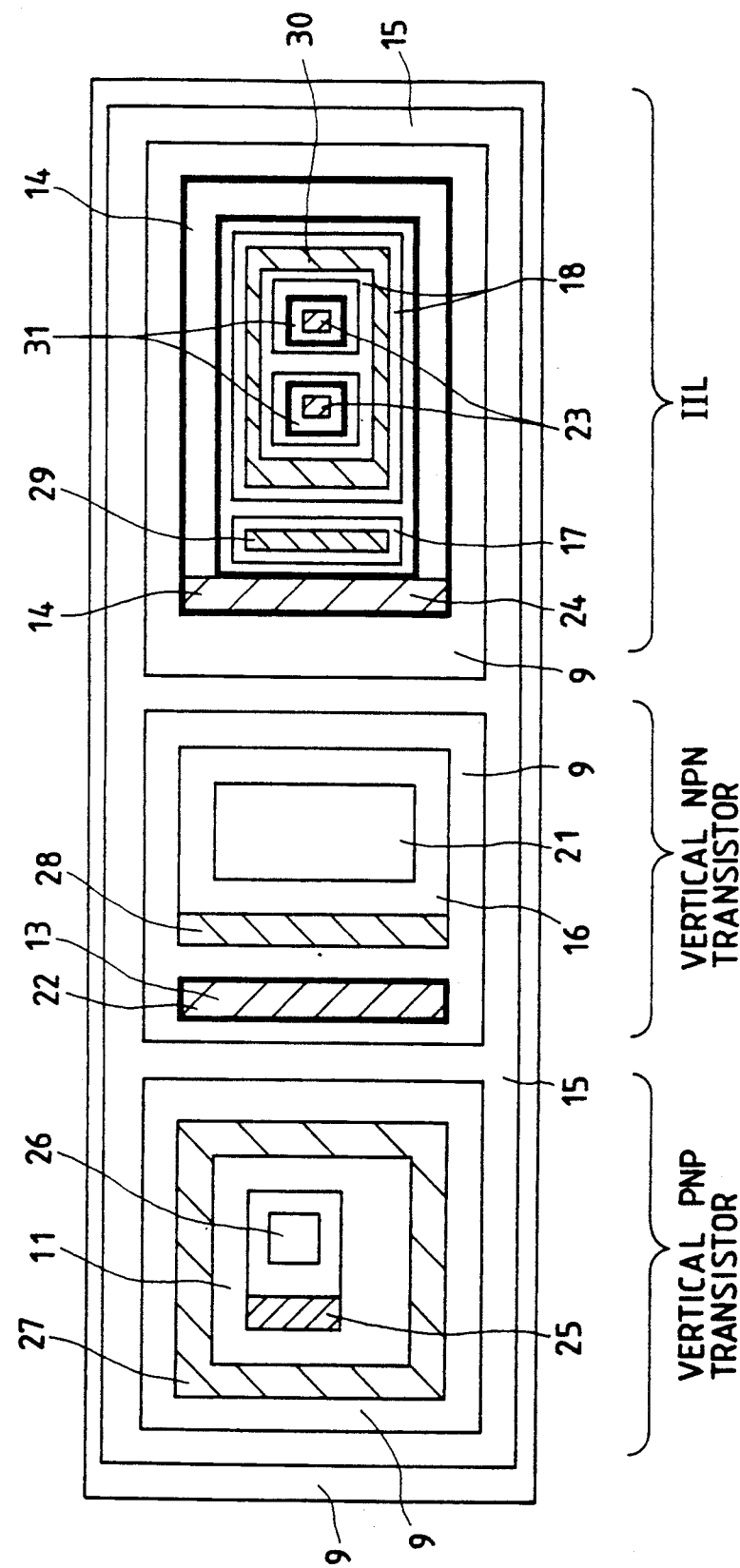
FIG. 3B is a plan view of FIG. 3A.

Next, for example, using a resist as a mask, ion implantation of boron is carried out under conditions of 30 keV and $2 \times 10^{13}/cm^2$, followed by heating at about 900° C. for about 30 minutes to form a p-type diffused layer 16 serving as the base region of the vertical npn transistor, a p-type diffused layer 17 serving as the injector region of the IIL, a p-type diffused layer 18 that constitutes part of the base region of the IIL, and a p-type diffused layer 15 that constitutes part of the device separating region. Next, for example, using a resist as a mask, ion implantation of phosphorus is carried out under conditions of 80 keV and $3.6 \times 10^{13}/cm^2$ to form an n-type diffused layer 19 serving as the base region of the vertical pnp transistor. Then a polycrystalline silicone film (not shown in the drawings) is formed on the regions serving as the collector contact, base contact and emitter of the vertical pnp transistor, on the regions serving as the collector contact, base contact and emitter of the vertical npn transistor and on the regions of the injector contact, collector contact, base contact and emitter contact of the IIL. Thereafter, for example, using a resist as a mask, the polycrystalline silicone film formed on the region serving as the base contact of the vertical pnp transistor, on the regions serving as the collector contact and emitter of the vertical npn transistor and on the regions of the collector contact and emitter contact of the IIL, is ion-implanted with arsenic under conditions of 60 keV and $1 \times 10^{16}/cm^2$, followed by heating at about 950° C. for about 60 minutes to make the arsenic diffuse from the polycrystalline silicone film, thereby forming an n+-type diffused layer 25 serving as the base contact region of the vertical pnp transistor, an n+-type diffused layer 22 serving as the collector contact region and an n+-type diffused layer 21 serving as the emitter region, of the vertical npn transistor, and an n+-type diffused layer 23 (which is in plurality in the drawings) serving as the collector region and an n+-type diffused layer 24 serving as the emitter contact region, of the IIL. Next, for example, using a resist as a mask, the polycrystalline silicon film formed on the region serving as the base contact of the vertical npn transistor, on the regions serving as the collector contact and emitter of the vertical pnp transistor and on the regions serving as the injector contact and base contact of the IIL, is ion-implanted with boron under conditions of 30 keV and $2 \times 10^{16}/cm^2$, followed by heating at about 900° C. for about 45 minutes to make the boron diffuse from the polycrystalline silicone film, thereby forming a p+-type diffused layer 28 serving as the base contact region of the vertical npn transistor, a p+-type diffused layer 27 serving as the collector contact region and a p+-type diffused layer 26 serving as the emitter region, of the vertical pnp transistor, and a p+-type diffused layer 29 serving as the injector contact region and a p+-type diffused layer 30 serving as the base contact region, of the IIL (FIGS. 3A, 3B). As a final step, for example, using Al or the like, electrode wiring may be formed. The present semiconductor device is thus completed.

Figure 4:
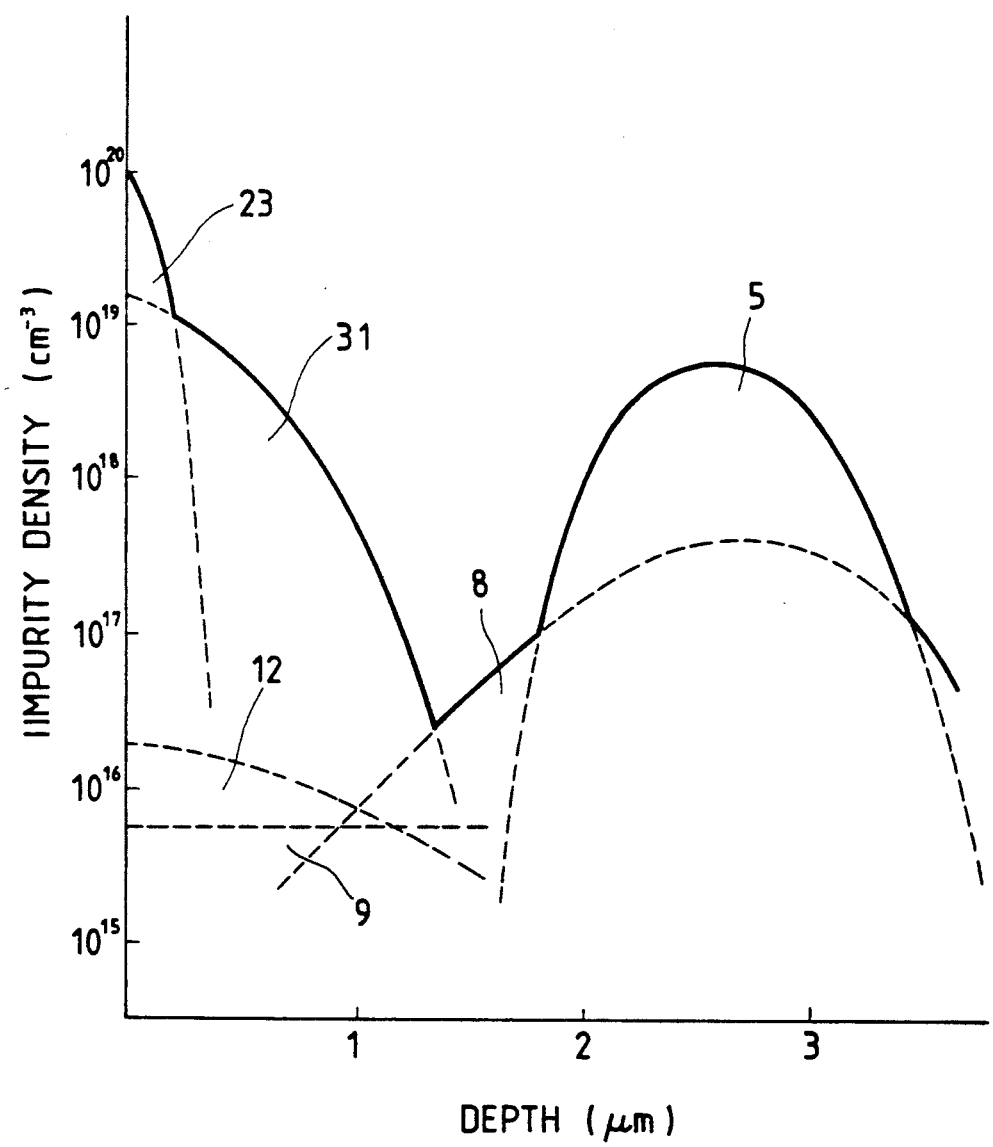
FIG. 4 is a profile of impurity distribution right beneath a collector of the IIL in the first embodiment of the present invention.

As described above, the present embodiment is characterized in that the p+-type buried layer 8 serving as the base region of the IIL is formed at the same time as the formation of the high-density p+-type buried layer 7 serving as the collector buried layer of the vertical pnp transistor, the emitter region of the IIL is formed of the n+-type buried layer 5 having a higher impurity density than this p+-type buried layer 8, and the high-density n+-type diffused layer 31 serving as the collector region of the IIL is formed at the same time as the formation of the high-density n+-type diffused layer 13 serving as the collector wall of the vertical npn transistor, where this n+-type diffused layer 31 is so formed as to come into contact with the p+-type buried layer 8 serving as the base region of the IIL. FIG. 4 shows a profile of impurity densities right beneath the collector of the IIL.

In this way the emitter region is so formed as to have a higher impurity density than the impurity density of the base region of IIL coming into contact therewith, and hence the emitter injection efficiency can be made higher and the current gain can be made much greater. In addition, the p+-type buried layer 8 serving as the base region of the IIL is made to have an impurity density profile which is so inclined as to become lower from the emitter toward the collector, and hence an electric field formed with this impurity density gradient accelerates carriers present in the base region to bring about an improvement in the operation speed of the IIL. Even when the epitaxial layer is made thin so that the speed and compactness of the device can be made higher, the collector and emitter can be prevented from coming into a punch-through state between them and the breakdown voltage can be made higher, since the base impurity density of the IIL can be made higher. Moreover, the base impurity density of the IIL can be made higher without increasing the impurity density of the p−-type diffused layer 12 that constitutes part of the base region of the IIL, in other words, without increasing the impurity density of the p−-type diffused layer 11 that constitutes part of the collector region of the vertical pnp transistor formed at the same time as the p−-type diffused layer 12. Hence, the collector-emitter breakdown voltage can be made higher without lowering of the Early voltage of the vertical pnp transistor. Furthermore, the collector wall of the vertical npn transistor and the collector region of the IIL are formed at the same time, and this collector region is so formed as to come into contact with the p+-type buried layer 8 serving as the base region of the IIL. Hence, the base width of the IIL can be made smaller, and the speed of the IIL can be made higher. In addition, according to the present embodiment, the advantages sated above can be achieved by the same number of steps as in the conventional fabrication.

Figure 5:
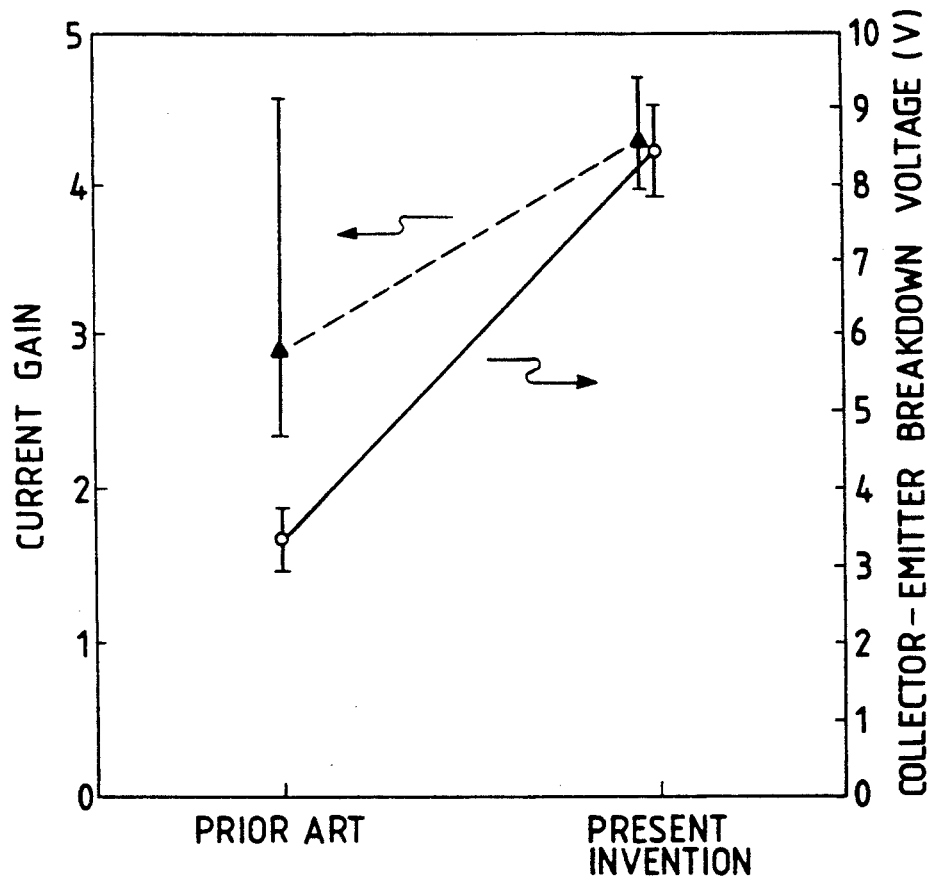
FIG. 5 is a graph to show the current gain and collector-emitter breakdown voltage of the IIL in the first embodiment of the present invention.
Figure 6:
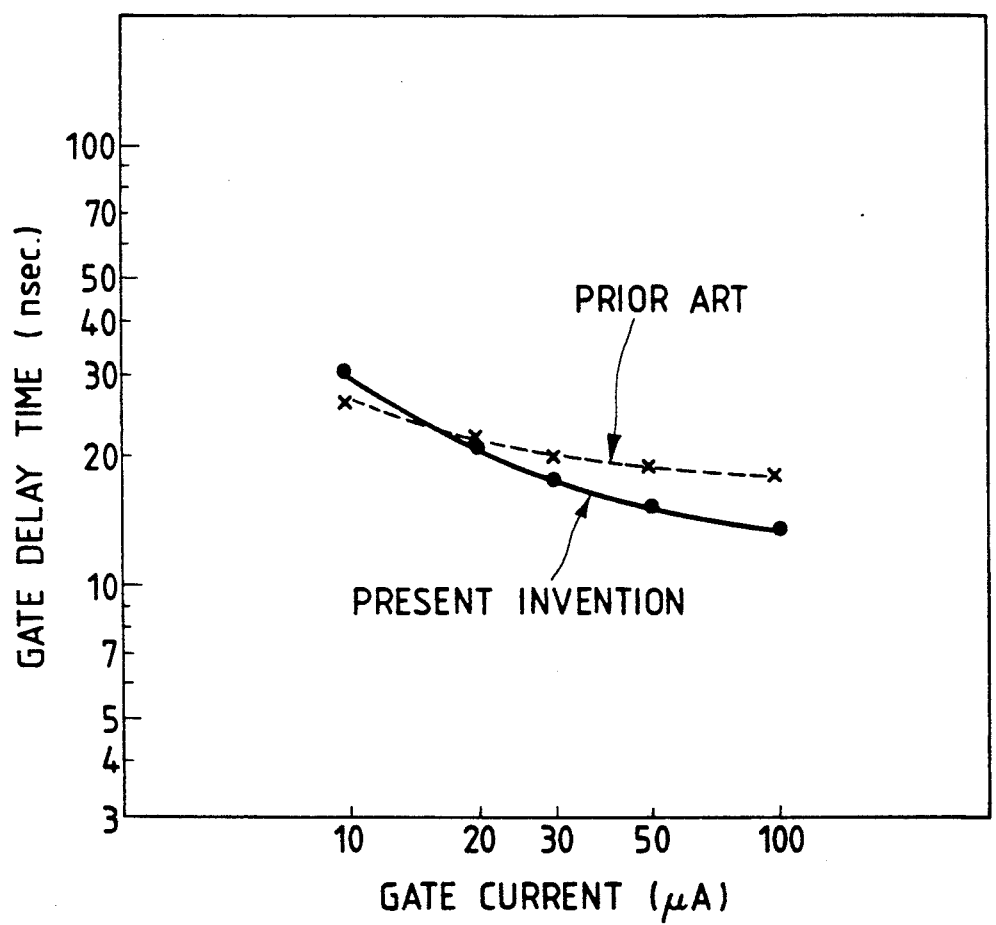
FIG. 6 is a graph to show gate current dependence of gate delay time of the IIL in the first embodiment of the present invention.

FIG. 5 shows the current gain and collector-emitter breakdown voltage of the IIL fabricated as an experiment according to the first embodiment of the present invention. FIG. 6 shows gate delay time of the IIL fabricated as an experiment according to the first embodiment of the present invention. As is clear from FIGS. 5 and 6, the current gain, collector-emitter breakdown voltage and gate delay time of the IIL of the present invention has been greatly improved as compared with those of the conventional IIL.

Second Embodiment

Figure 7A:
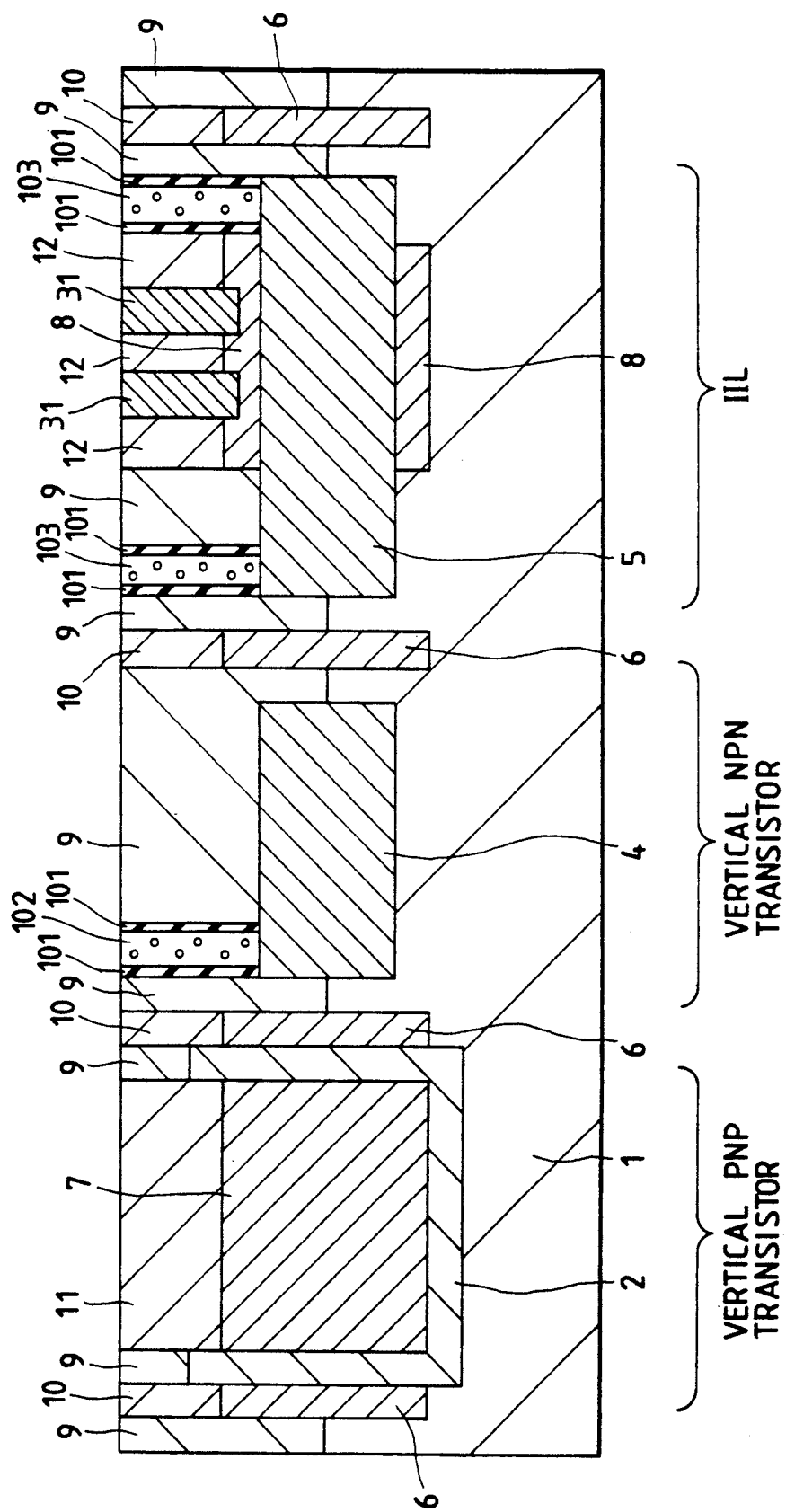
FIG. 7A is a cross-sectional illustration of a second fabrication step in a second embodiment of the present invention.

FIGS. 7A/7B and 8 cross-sectionally illustrate a process of fabricating a semiconductor device according to a second embodiment of the present invention. In these drawings, reference numerals of common components all correspond to those in the drawings illustrating the first embodiment. In the present embodiment, the fabrication steps up to those shown in FIG. 1 of the first embodiment are the same, and are omitted here.

Figure 7B:
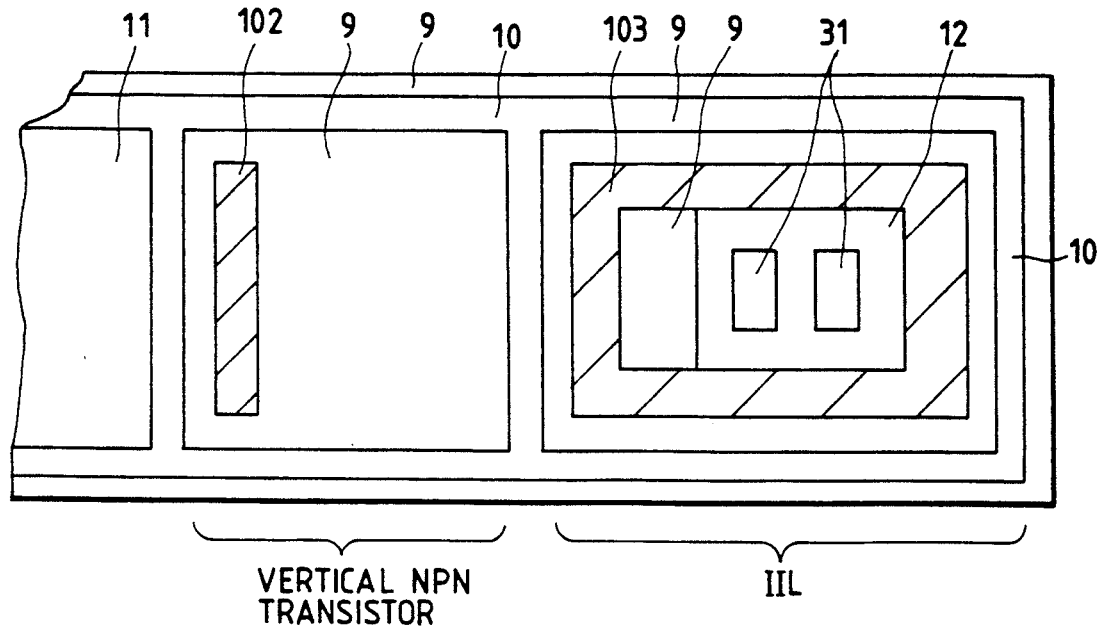
FIG. 7B is a partial plan view of FIG. 7A.

After the steps shown in FIG. 1, an $n^-$-type epitaxial layer 9 with, e.g., an average resistivity of about $1\Omega.\text{cm}$ and a thickness of about 2.5 $\mu$m is formed on the p-type semiconductor substrate 1. Next, for example, using a resist as a mask, ion implantation of boron is carried out under conditions of 80 keV and $2\times10^{12}/\text{cm}^2$, followed by heating at about 1,100° C. for about 100 minutes to form a $p^-$-type diffused layer 11 that constitutes part of the collector region of the vertical pnp transistor, a $p^-$-type diffused layer 12 that constitutes part of the base region of the IIL, and a $p^-$-type diffused layer 10 that constitutes part of the device separating region and serves as an upper separating region. In this instance, the coefficients of diffusion of the impurities become larger in order of arsenic, boron and phosphorus, and hence the rises of the buried layers become larger in order of the $n^+$-type buried layers 4 and 5, $p^+$-type buried layers 6, 7 and 8 and the n-type buried layer 2. Hence, in the IIL, the $p^+$-type buried layer 8 protrudes from the $n^+$-type buried layer 5 and is connected with the $p^-$-type diffused layer 12, so that the base region of the IIL is formed. Next, for example, using a resist as a mask, ion implantation of phosphorus is carried out under conditions of 80 keV and $3\times10^{15}/\text{cm}^2$, followed by heating at about 950° C. for about 30 minutes and further by heating at about 1,000° C. for about 145 minutes to form an $n^+$-type diffused layer 31 (which is in plurality in the drawings) serving as the collector region of the IIL. Next, for example, using a resist as a mask, anisotropic etching is carried out so that grooves with a width of about 1 $\mu$m reaching the $n^+$-type buried layers 4 and 5, respectively, are formed in the regions serving as a collector lead-out electrode of the vertical npn transistor and an emitter lead-out electrode of the IIL, respectively, followed by heating at about 900° C. for about 20 minutes to form oxide films 101 of about 50 nm thick each in the grooves. Here, the groove in the IIL is formed in such a way that the sides of the $p^-$-type diffused layer 12 and $p^+$-type buried layer 8 serving as the base region of the IIL come into contact with the oxide film 101 at one side wall of the groove. Thereafter, the oxide films at the bottoms of the grooves are removed by anisotropic etching so that the oxide films 101 remain only on the side walls of the grooves. Next, a polycrystalline silicone film containing an n-type impurity as exemplified by phosphorus is deposited in a thickness of about 2 $\mu$m, followed by etchback or polishing to remove the polycrystalline silicone film except those in the grooves, thereby forming an $n^+$-type polycrystalline silicone film 102 serving as the collector lead-out electrode of the vertical npn transistor and an $n^+$-type polycrystalline silicone film 103 serving as the lead-out electrode of the IIL (FIGS. 7A, 7B). In this instance, the n-type impurity may be introduced into the polycrystalline silicone film by ion implantation or gas-phase diffusion, after a non-doped polycrystalline silicone film has been deposited.

Figure 8:
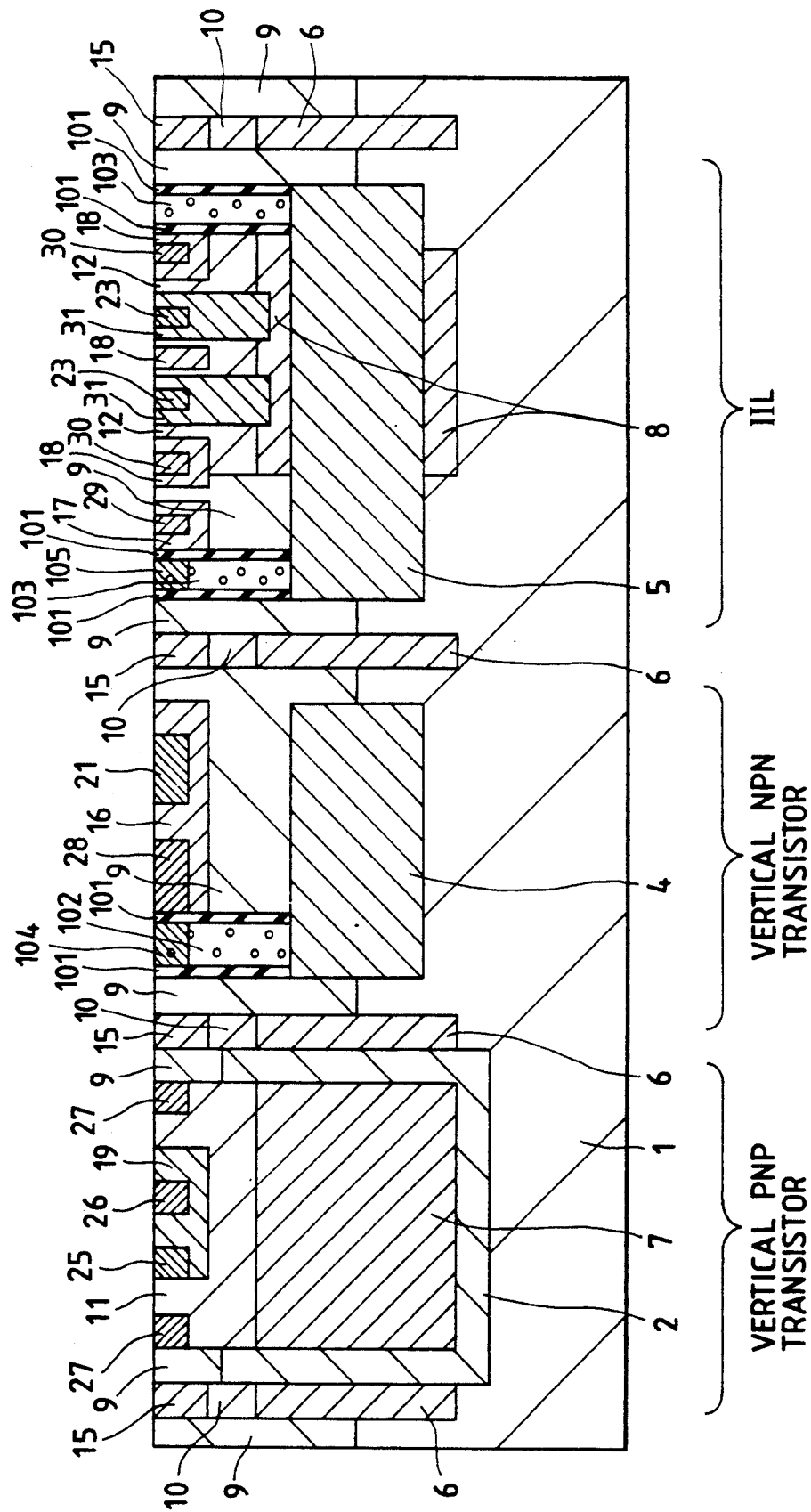
FIG. 8 is a cross-sectional illustration of a third fabrication step in the second embodiment of the present invention.

Next, for example, using a resist as a mask, ion implantation of boron is carried out under conditions of 30 keV and $2\times10^{13}/\text{cm}^2$, followed by heating at about 900° C. for about 30 minutes to form a p-type diffused layer 16 serving as the base region of the vertical npn transistor, a p-type diffused layer 17 serving as the injector region of the IIL, a p-type diffused layer 18 that constitutes part of the base region of the IIL, and a p-type diffused layer 15 that constitutes part of the device separating region. Here, the p-type diffused layer 17 serving as the injector region of the IIL is formed in such a way that its one side comes into contact with the oxide film 101 at one side wall of the groove serving as the emitter lead-out electrode. The p-type diffused layer 16 serving as the base region of the vertical npn transistor is also formed in such a way that its one side comes into contact with the oxide film 101 at one side wall of the groove serving as the collector lead-out electrode. Next, for example, using a resist as a mask, ion implantation of phosphorus is carried out under conditions of 80 keV and $3.6\times10^{13}/\text{cm}^2$ to form an n-type diffused layer 19 serving as the base region of the vertical pnp transistor. Then a polycrystalline silicone film (not shown in the drawings) is formed on the regions serving as the collector contact, base contact and emitter of the vertical pnp transistor, on the regions serving as the collector contact, base contact and emitter of the vertical npn transistor and on the regions of the injector contact, collector contact, base contact and emitter contact of the IIL. Thereafter, for example, using a resist as a mask, the polycrystalline silicone film formed on the region serving as the base contact of the vertical pnp transistor, on the regions serving as the collector contact and emitter of the vertical npn transistor and on the regions of the collector contact and emitter contact of the IIL, is ion-implanted with arsenic under conditions of 60 keV and $1\times10^{16}/\text{cm}^2$, followed by heating at about 950° C. for about 60 minutes to make the arsenic diffuse from the polycrystalline silicone film, thereby forming an $n^+$-type diffused layer 25 serving as the base contact region of the vertical pnp transistor, an $n^+$-type diffused layer 104 serving as the collector contact region and an $n^+$-type diffused layer 21 serving as the emitter region, of the vertical npn transistor, and an $n^+$-type diffused layer 23 (which is in plurality in the drawings) serving as the collector region and an $n^+$-type diffused layer 105 serving as the emitter contact region, of the IIL. Next, using a resist as a mask, the polycrystalline silicone film formed on the region serving as the base contact of the vertical npn transistor, on the regions serving as the collector contact and emitter of the vertical pnp transistor and on the regions serving as the injector contact and base contact of the IIL, is ion-implanted with boron under conditions of 30 keV and $2\times10^{16}/\text{cm}^2$, followed by heating at about 900° C. for about 45 minutes to make the boron diffuse from the polycrystalline silicone film, thereby forming a $p^+$-type diffused layer 28 serving as the base contact region of the vertical npn transistor, a $p^+$-type diffused layer 27 serving as the collector contact region and a $p^+$-type diffused layer 26 serving as the emitter region, of the vertical pnp transistor, and a $p^+$-type diffused layer 29 serving as the injector contact region and a $p^+$-type diffused layer 30 serving as the base contact region, of the IIL (FIG. 8). As a final step, for example, using Al or the like, electrode wiring may be formed. The present semiconductor device is thus completed.

As described above, in addition to the features of the first embodiment, the present embodiment is characterized in that the oxide film 101 is formed on side walls and the groove filled therein with the n+-type polycrystalline silicone film 103 is made to serve as the emitter lead-out electrode of the IIL, where one sides of the p-type diffused layer 17, p-type diffused layer 18, p−-type diffused layer 12 and p+-type buried layer 8 of the IIL are so formed as to be surrounded with the oxide film 101. Hence, in addition to the advantages in the first embodiment, there are the advantages that the parasitic capacitance between the base and emitter of the IIL can be greatly decreased and the operation speed of the device can be made higher. Moreover, it is unnecessary to leave a margin between the emitter and the base so that they do not come into contact with each other, and hence the size of the device can be made smaller and also can be made more compact.

Third embodiment

Figure 9B:
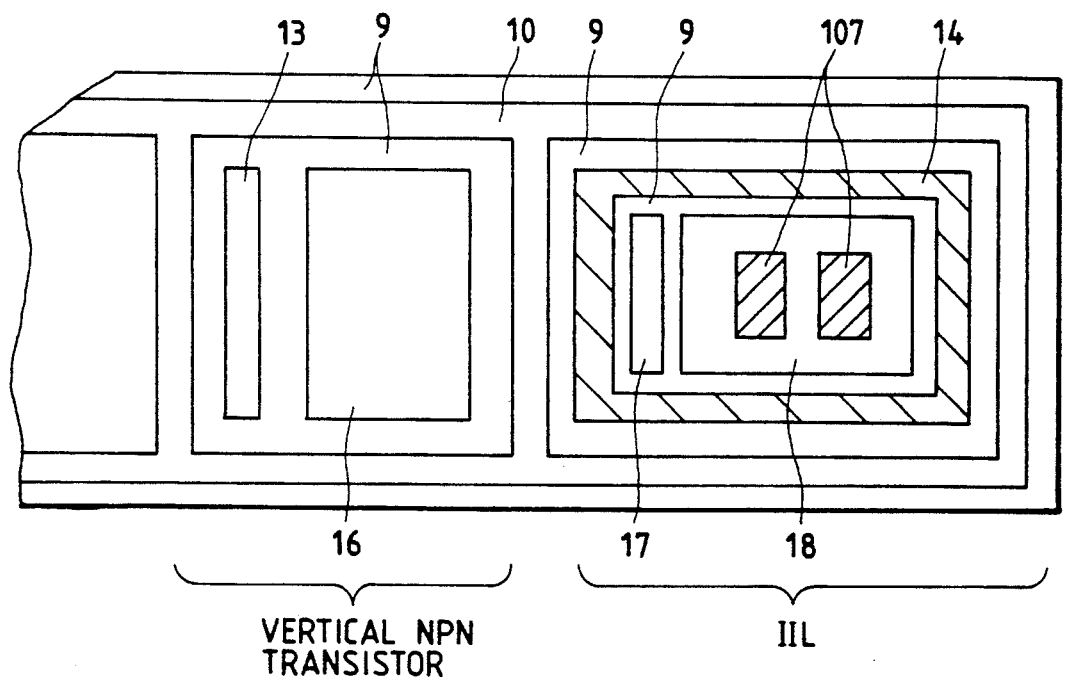
FIG. 9B is a partial plan view of FIG. 9A.
Figure 9A:
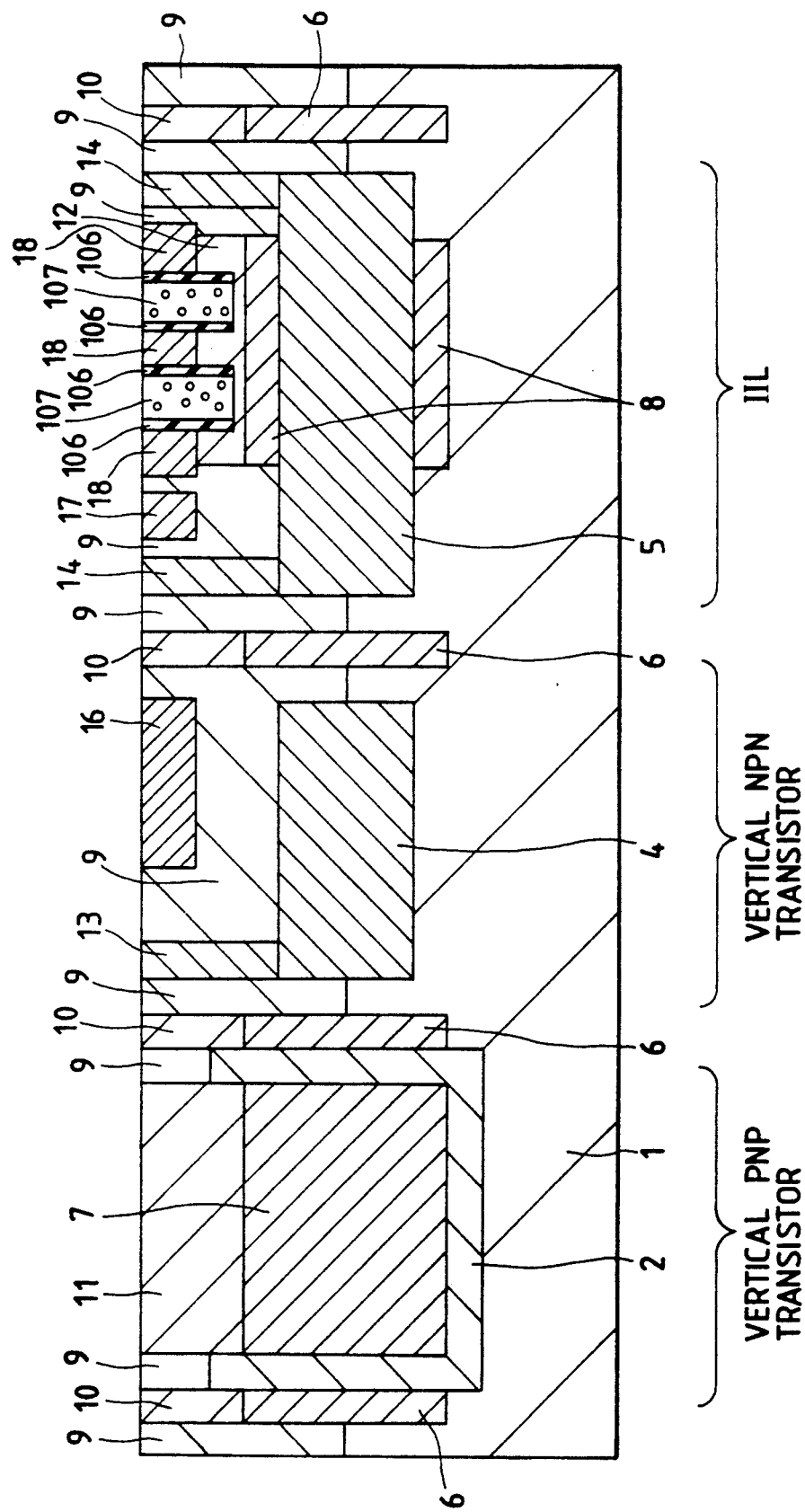
FIG. 9A is a cross-sectional illustration of a second fabrication step in a third embodiment of the present invention.

FIGS. 9A/9B and 10 cross-sectionally illustrate a process of fabricating a semiconductor device according to a second embodiment of the present invention. In these drawings, the reference numerals of common components all correspond to those in the drawings illustrating the first embodiment. In the present embodiment, the fabrication steps up to those shown in FIG. 1 of the first embodiment are the same, and are omitted here.

After the steps shown in FIG. 1, an n−-type epitaxial layer 9 with, e.g., an average resistivity of about 1Ω.cm and a thickness of about 2.5 μm is formed on the p-type semiconductor substrate 1. Next, for example, using a resist as a mask, ion implantation of boron is carried out under conditions of 80 keV and $2 \times 10^{12}/cm^2$, followed by heating at about 1,100° C. for about 100 minutes to form a p−-type diffused layer 11 that constitutes part of the collector region of the vertical pnp transistor, a p−-type diffused layer 12 that constitutes part of the base region of the IIL, and a p−-type diffused layer 10 that constitutes part of the device separating region and serves as an upper separating region. In this instance, the coefficients of diffusion of the impurities become larger in order of arsenic, boron and phosphorus, and hence the rises of the buried layers become larger in order of the n+-type buried layers 4 and 5, p+-type buried layers 6, 7 and 8 and the n-type buried layer 2. Hence, in the IIL, the p+-type buried layer 8 protrudes from the n+-type buried layer 5 and is connected with the p+-type diffused layer 12, so that the base region of the IIL is formed. Next, for example, using a resist as a mask, ion implantation of phosphorus is carried out under conditions of 80 keV and $3 \times 10^{15}/cm^2$, followed by heating at about 950° C. for about 30 minutes and further by heating at about 1,000° C. for about 145 minutes to form an n+-type diffused layer 13 serving as a collector wall region of the vertical npn transistor and an n+-type diffused layer 14 that constitutes part of the emitter region of the IIL.

Next, for example, using a resist as a mask, ion implantation of boron is carried out under conditions of 30 keV and $2 \times 10^{13}/cm^2$, followed by heating at about 900° C. for about 30 minutes to form a p-type diffused layer 16 serving as the base region of the vertical npn transistor, a p-type diffused layer 17 serving as the injector region of the IIL, a p-type diffused layer 18 that constitutes part of the base region of the IIL, and a p-type diffused layer 15 that constitutes part of the device separating region. Next, for example, using a resist as a mask, anisotropic etching is carried out so that a groove (which is in plurality in the drawings) with a width of about 1 μm substantially reaching the p+-type buried layer 8 is formed in the region serving as a collector lead-out electrode of the IIL, followed by heating at about 900° C. for about 20 minutes to form an oxide film 106 of about 50 nm thick in the groove. Thereafter, the oxide film at the bottom of the groove is removed by anisotropic etching so that the oxide film 106 remains only on the side walls of the groove. Next, a polycrystalline silicone film containing an n-type impurity as exemplified by phosphorus is deposited, followed by etchback or polishing to remove the polycrystalline silicone film except those in the groove, thereby forming an n+-type polycrystalline silicone film 107 (which is in plurality in the drawings) serving as the collector lead-out electrode of the IIL (FIGS. 9A, 9B). In this instance, the n-type impurity may be introduced into the polycrystalline silicone film by ion implantation or gas-phase diffusion, after an non-doped polycrystalline silicone film has been deposited. The p-type diffused layer 16 serving as the base region of the vertical npn transistor, p-type diffused layer 17 serving as the injector region of the IIL, p-type diffused layer 18 that constitutes part of the base region of the IIL and p-type diffused layer 15 that constitutes part of the device separating region may also be formed after the collector lead-out electrode of the IIL has been formed.

Figure 10:
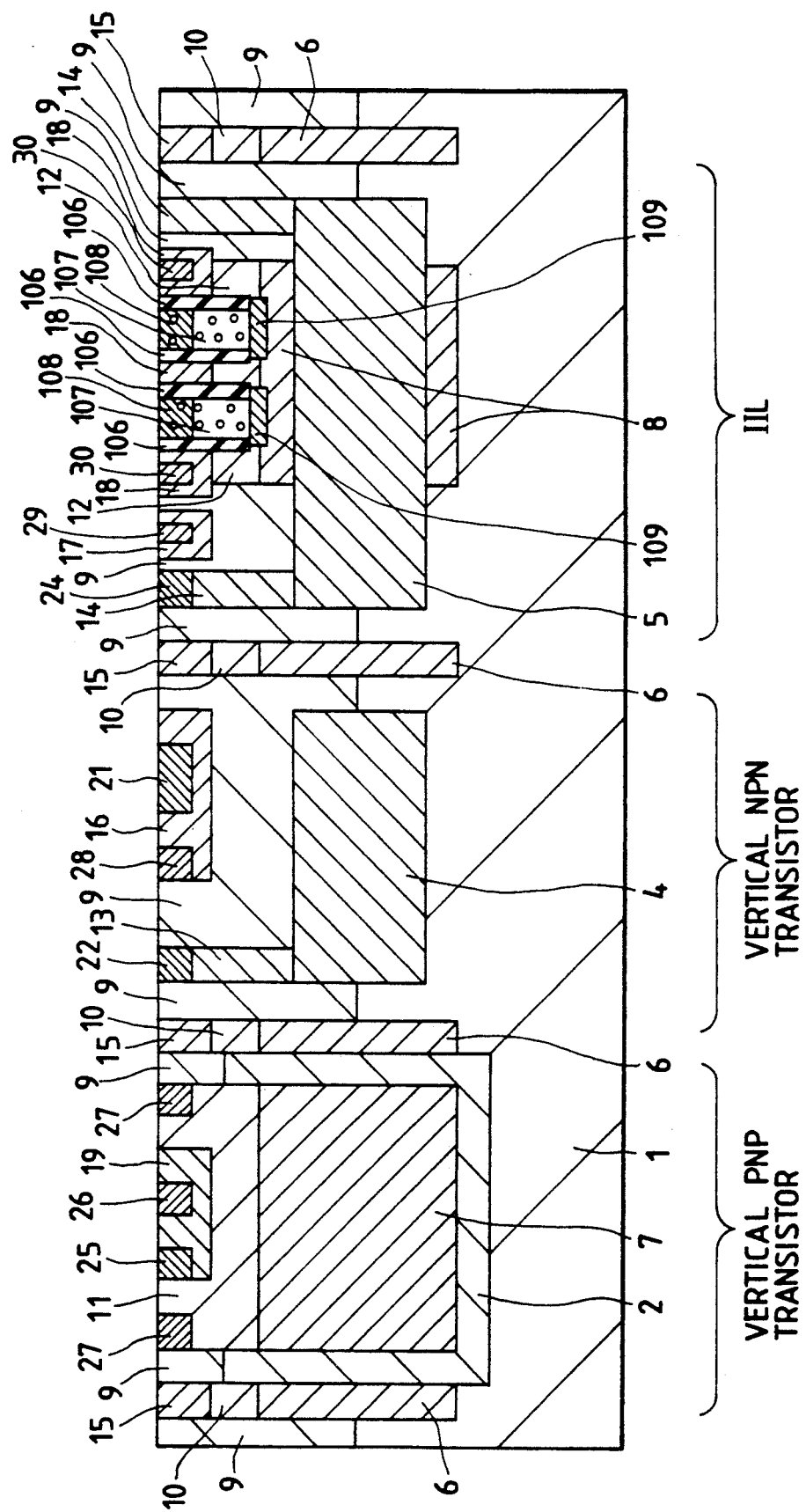
FIG. 10 is a cross-sectional illustration of a third fabrication step in the third embodiment of the present invention.
Figure 11:
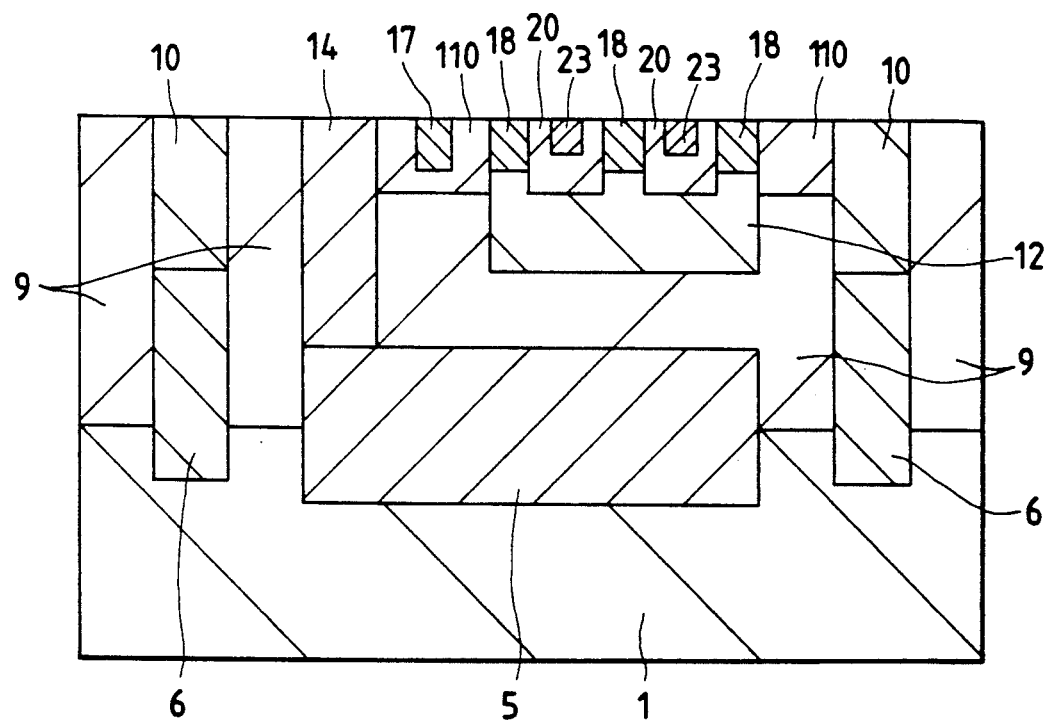
FIG. 11 is a cross-sectional structure of a conventional semiconductor device.
Figure 12:
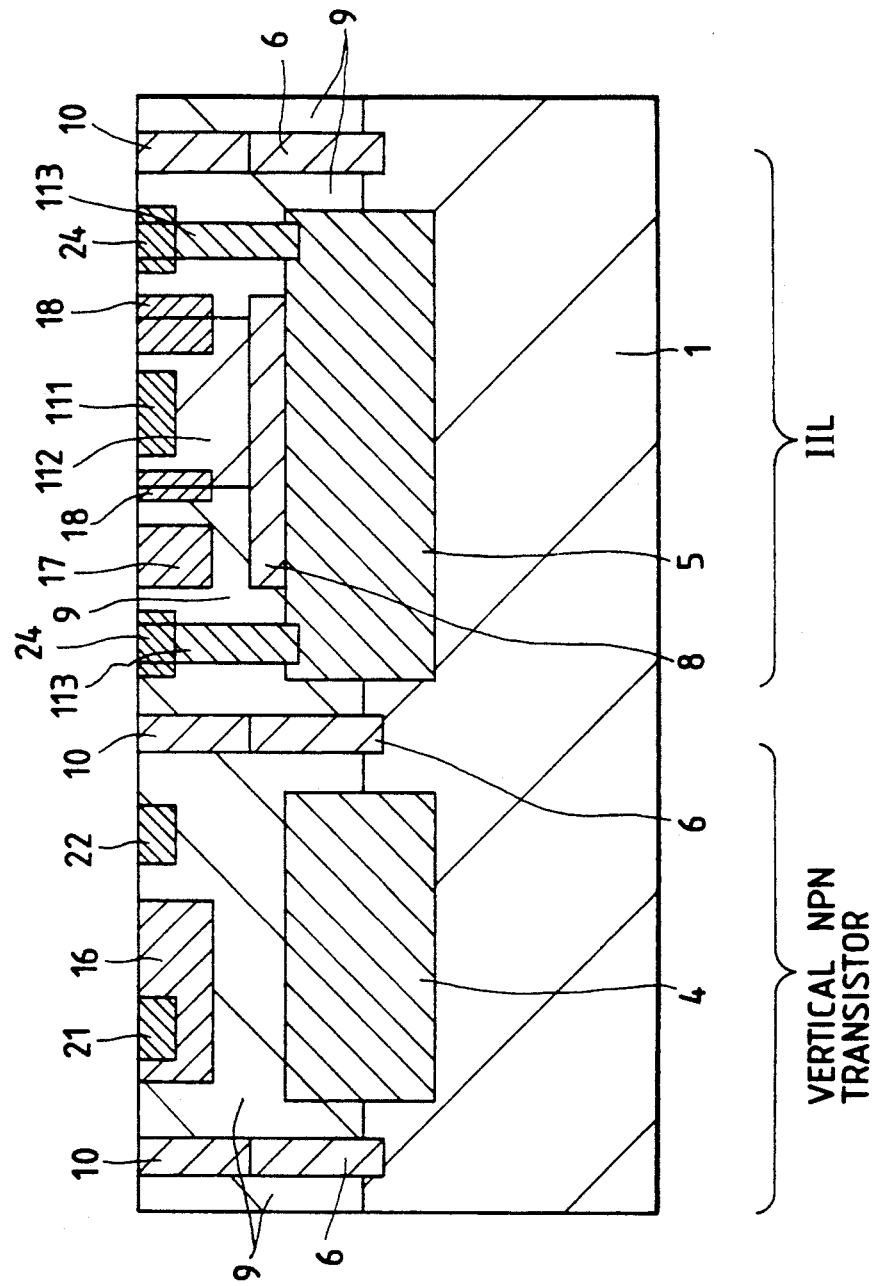
FIG. 12 is a cross-sectional structure of another conventional semiconductor device.

Next, for example, using a resist as a mask, ion implantation of phosphorus is carried out under conditions of 80 keV and $3.6 \times 10^{13}/cm^2$ to form an n-type diffused layer 19 serving as the base region of the vertical pnp transistor. Then a polycrystalline silicone film (not shown in the drawings) is formed on the regions serving as the collector contact, base contact and emitter of the vertical pnp transistor, on the regions serving as the collector contact, base contact and emitter of the vertical npn transistor and on the regions of the injector contact, collector contact, base contact and emitter contact of the IIL. Thereafter, for example, using a resist as a mask, the polycrystalline silicone film formed on the region serving as the base contact of the vertical pnp transistor, on the regions serving as the collector contact and emitter of the vertical npn transistor and on the regions of the collector contact and emitter contact of the IIL, is ion-implanted with arsenic under conditions of 60 keV and $1 \times 10^{16}/cm^2$, followed by heating at about 950° C. for about 60 minutes to make the arsenic diffuse from the polycrystalline silicone film, thereby forming an n+-type diffused layer 25 serving as the base contact region of the vertical pnp transistor, an n+-type diffused layer 22 serving as the collector contact region and an n+-type diffused layer 21 serving as the emitter region, of the vertical npn transistor, and an n+-type diffused layers 108 (which is in plurality in the drawings) and 24 serving as the collector region and the emitter contact region, respectively, of the IIL. Here, phosphorus is simultaneously diffused from the n+-type polycrystalline silicone film 107, so that an n+-type diffused layer 109 (which is in plurality in the drawings) is formed at the bottom of the groove serving as the collector lead-out electrode and in contact with the p+-type buried layer 8. Next, for example, using a resist as a mask, the polycrystalline silicone film formed on the region serving as the base contact of the vertical npn transistor, on the regions serving as the collector contact and emitter of the vertical pnp transistor and on the regions serving as the injector contact and base contact of the IIL, is ion-implanted with boron under conditions of 30 keV and $2\times10^{16}/cm^2$, followed by heating at about 900° C. for about 45 minutes to make the boron diffuse from the polycrystalline silicone film, thereby forming a p+-type diffused layer 28 serving as the base contact region of the vertical npn transistor, a p+-type diffused layer 27 serving as the collector contact region and a p+-type diffused layer 26 serving as the emitter region, of the vertical pnp transistor, and a p+-type diffused layer 29 serving as the injector contact region and a p+-type diffused layer 30 serving as the base contact region, of the IIL (FIG. 10). As a final step, for example, using Al or the like, electrode wiring may be formed. The present semiconductor device is thus completed.

As described above, in addition to the features of the first embodiment, the present embodiment is characterized in that the oxide film 106 is formed on side walls, and the groove filled therein with the n+-type polycrystalline silicone film 107 is made to serve as the collector lead-out electrode of the IIL. Hence, in addition to the advantages in the first embodiment, there are the advantages that the parasitic capacitance between the base and collector of the IIL can be greatly decreased and the operation speed of the device can be made higher. Moreover, because of the oxide film 107 formed on the side walls of the groove serving as the collector lead-out electrode of the IIL, the phosphorus is prevented from being diffused in the lateral direction. Hence, there is no possibility of a lowering of the breakdown voltage even when the plural collectors are made close one another to a minimum rule, and hence the size of the device can be made smaller and also can be made more compact.

As having been described above, according to the present invention, the p+-type buried layer serving as the base region of the IIL is formed at the same time as the formation of the high-density p+-type buried layer serving as the collector buried layer of the vertical pnp transistor, and the emitter region of the IIL is formed of the n+-type buried layer 5 having a higher impurity density than this p+-type buried layer. This makes it possible to form the emitter region so as to have a higher impurity density than the impurity density of the base region of IIL with which the emitter comes into contact, and hence the emitter injection efficiency can be made higher and the current gain can be made much greater. In addition, even when the epitaxial layer is made thin so that the speed and compactness of the device can be made higher, the collector and emitter can be prevented from coming into a punch-through state between them and the breakdown voltage can be made higher, since the base impurity density of the IIL can be made higher. Moreover, the base impurity density of the IIL can be made higher without increasing the impurity density of the p−-type diffused layer that constitutes part of the base region of the IIL, in other words, without increasing the impurity density of the p−-type diffused layer that constitutes part of the collector region of the vertical pnp transistor formed at the same time. Hence, the collector-emitter breakdown voltage in the IIL can be made higher without causing a lowering of the Early voltage of the vertical pnp transistor. Furthermore, the p+-type buried layer serving as the base region of the IIL is made to have an impurity density profile which is so inclined as to become lower from the emitter toward the collector, and hence an electric field formed with this impurity density gradient accelerates carries present in the base region to bring about an improvement in the operation speed of the IIL. In addition, the collector region of the IIL is formed at the same time as the collector wall of the vertical npn transistor, where this collector region is so formed as to come into contact with the p+-type buried layer serving as the base region of the IIL. Hence, the base width of the IIL can be made smaller, and the speed of the IIL can be made higher. Thus it is possible to provide the semiconductor device in which the IIL with a high speed, high compactness and high breakdown voltage, the vertical pnp transistor and the vertical npn transistor are integrated, using the same number of steps as the conventional devices.

Still further, according to the second embodiment, the oxide film 101 is formed on side walls, and the groove filled therein with the n+-type polycrystalline silicone film 103 is made to serve as the emitter lead-out electrode of the IIL, where one sides of the p-type diffused layer 17, p-type diffused layer 18, p−-type diffused layer 17 and p+-type buried layer 8 of the IIL are so formed as to be surrounded with the oxide film 101. Hence, the parasitic capacitance between the base and emitter of the IIL can be greatly decreased and the operation speed of the device can be made higher. Moreover, it is unnecessary to leave a margin between the emitter and the base so that they do not come into contact with each other, and hence the size of the device can be made smaller and also can be made more compact. Thus it is possible to provide the semiconductor device in which the IIL with a high speed, high compactness and high breakdown voltage, the vertical pnp transistor and the vertical npn transistor are integrated.

Still further, according to the third embodiment, the oxide film 106 is formed on side walls, and the groove filled therein with the n+-type polycrystalline silicone film 107 is made to serve as the collector lead-out electrode of the IIL. Hence, the parasitic capacitance between the base and collector of the IIL can be greatly decreased and the operation speed of the device can be made higher. Moreover, because of the oxide film 107 formed on the side walls of the groove serving as the collector lead-out electrode of the IIL, the phosphorus is prevented from being diffused in the lateral direction. Hence, there is no possibility of a lowering of the breakdown voltage even when the plural collectors are made close one another to a minimum rule, and hence the size of the device can be made smaller and also can be made more compact. Thus it is possible to provide the semiconductor device in which the IIL with a high speed, high compactness and high breakdown voltage, the vertical pnp transistor and the vertical npn transistor are integrated.

What is claimed is:

1. A method of fabricating a semiconductor device having a vertical npn transistor, a vertical pnp transistor and an IIL, comprising the steps of;

forming in a one-conductivity type semiconductor substrate a reverse-conductivity type first buried layer;

forming in said first buried layer a one-conductivity type second buried layer;

forming on said semiconductor substrate having said first and second buried layers a reverse-conductivity type semiconductor layer;

forming in said semiconductor layer a one-conductivity type first diffused layer coming into contact with said second buried layer;

forming in said first diffused layer a reverse-conductivity type second diffused layer in singularity or plurality; and forming a one-conductivity type third diffused layer at a position set apart in the lateral direction with respect to said first diffused layer;

said first buried layer being made to serve as an emitter of the IIL, said second buried layer and said first diffused layer as the base of the IIL, said second diffused layer as a collector of the IIL, and said third diffused layer as an injector of the IIL; said second diffused layer being so formed as to come into contact with said second buried layer; the impurity density of the base right beneath the collector being lower than the impurity density of the emitter; and the impurity density of the base being made to monotonously become lower from the emitter toward the collector.

2. A method of fabricating a semiconductor device according to claim 1, wherein;

a collector buried layer in the vertical npn transistor is formed at the same time as the formation of said first buried layer;

a lower separating region in the device separating region and a collector buried layer in the vertical pnp transistor are formed at the same time as the formation of said second buried layer;

an upper separating region in the device separating region and a collector region in the vertical pnp transistor are formed at the same time as the formation of said first diffused layer;

a collector wall region in the vertical npn transistor is formed at the same time as the formation of said second diffused layer; and a base region in the vertical npn transistor is formed at the same time as the formation of said third diffused layer.

3. A method of fabricating a semiconductor device having a vertical npn transistor, a vertical pnp transistor and an IIL, comprising the steps of;

forming in a one-conductivity type semiconductor substrate a reverse-conductivity type first buried layer;

forming in said first buried layer a one-conductivity type second buried layer;

forming on said semiconductor substrate having said first and second buried layers a reverse-conductivity type first semiconductor layer;

forming in said first semiconductor layer a one-conductivity type first diffused layer coming into contact with said second buried layer;

forming in said first diffused layer a reverse-conductivity type second diffused layer coming into contact with said second buried layer, formed in singularity or plurality;

forming a one-conductivity type third diffused layer at a position set apart in the lateral direction with respect to said first diffused layer;

forming in said first semiconductor layer a groove that reaches said first buried layer, so formed as to surround the sides of said first diffused layer and said third diffused layer on their sides other than their sides opposed to each other;

forming an insulating film only on each side wall of said groove; and filling said groove with a reverse-conductivity type second semiconductor layer so as to be connected with said first buried layer at the bottom of said groove;

said first buried layer being made to serve as an emitter of the IIL, said second buried layer and said first diffused layer as the base of the IIL, said second diffused layer as a collector of the IIL, said third diffused layer as an injector of the IIL, and said second semiconductor layer as an emitter lead-out electrode of the IIL; the impurity density of the base right beneath the collector being lower than the impurity density of the emitter; and the impurity density of the base being made to monotonously become lower from the emitter toward the collector.

4. A method of fabricating a semiconductor device according to claim 3, wherein;

a collector buried layer in the vertical npn transistor is formed at the same time as the formation of said first buried layer;

a lower separating region in the device separating region and a collector buried layer in the vertical pnp transistor are formed at the same time as the formation of said second buried layer;

an upper separating region in the device separating region and a collector region in the vertical pnp transistor are formed at the same time as the formation of said first diffused layer;

a base region in the vertical npn transistor is formed at the same time as the formation of said third diffused layer; and a groove serving as a collector lead-out electrode in the vertical npn transistor, having an insulating film on each side wall thereof and filled therein with another second semiconductor layer is formed at the same time as the formation of the emitter lead-out electrode of the IIL.

5. A method of fabricating a semiconductor device having a vertical npn transistor, a vertical pnp transistor and an IIL, comprising the steps of;

forming in a one-conductivity type semiconductor substrate a reverse-conductivity type first buried layer;

forming in said first buried layer a one-conductivity type second buried layer;

forming on said semiconductor substrate having said first and second buried layers a reverse-conductivity type first semiconductor layer;

forming in said first semiconductor layer a one-conductivity type first diffused layer coming into contact with said second buried layer;

forming a one-conductivity type third diffused layer at a position set apart in the lateral direction with respect to said first diffused layer;

forming in said first diffused layer a groove that substantially reaches said second buried layer, formed in singularity or plurality;

forming an insulating film only on each side wall of said groove;

filling said groove with a reverse-conductivity type second semiconductor; and forming a reverse-conductivity type second diffused layer coming into contact with said second buried layer, by causing a reverse-conductivity type impurity to diffuse from said second semiconductor layer;

said first buried layer being made to serve as an emitter of the IIL, said second buried layer and said first diffused layer as the base of the IIL, said second diffused layer as a collector of the IIL, said third diffused layer as an injector of the IIL, and said second semiconductor layer as a collector lead-out electrode of the IIL; the impurity density of the base right beneath the collector being lower than the impurity density of the emitter; and the impurity density of the base being made to monotonously become lower from the emitter toward the collector.

6. A method of fabricating a semiconductor device according to claim 5, wherein;

a collector buried layer in the vertical npn transistor is formed at the same time as the formation of said first buried layer;

a lower separating region in the device separating region and a collector buried layer in the vertical pnp transistor are formed at the same time as the formation of said second buried layer;

an upper separating region in the device separating region and a collector region in the vertical pnp transistor are formed at the same time as the formation of said first diffused layer; and a base region in the vertical npn transistor is formed at the same time as the formation of said third diffused layer.

* * * * *